US007730385B2

(12) United States Patent
Smolinske et al.

(10) Patent No.: US 7,730,385 B2
(45) Date of Patent: Jun. 1, 2010

(54) METHOD FOR DECODING A RECEIVED CONTROL CHANNEL MESSAGE WITH A PRIORI INFORMATION

(75) Inventors: Jeffrey C. Smolinske, Schaumburg, IL (US); Michael E. Buckley, Grayslake, IL (US); Kenneth A. Stewart, Grayslake, IL (US)

(73) Assignee: Motorola, Inc., Schaumburg, IL (US)

( * ) Notice: Subject to any disclaimer, the term of this patent is extended or adjusted under 35 U.S.C. 154(b) by 823 days.

(21) Appl. No.: 11/289,858

(22) Filed: Nov. 30, 2005

(65) Prior Publication Data

US 2007/0124654 A1   May 31, 2007

(51) Int. Cl.
*H03M 13/00* (2006.01)
(52) U.S. Cl. ...................................................... 714/780
(58) Field of Classification Search .................. 714/780
See application file for complete search history.

(56) References Cited

U.S. PATENT DOCUMENTS

| | | | | | |
|---|---|---|---|---|---|
| 4,122,440 | A | * | 10/1978 | Langdon et al. | 341/51 |
| 4,623,936 | A | * | 11/1986 | Urban et al. | 358/470 |
| 4,827,475 | A | * | 5/1989 | Grover et al. | 370/527 |
| 5,477,272 | A | * | 12/1995 | Zhang et al. | 375/240.06 |
| 5,487,133 | A | * | 1/1996 | Park et al. | 706/20 |
| 5,663,957 | A | * | 9/1997 | Dent | 370/347 |
| 5,680,322 | A | * | 10/1997 | Shinoda | 714/18 |
| 5,729,538 | A | * | 3/1998 | Dent | 370/347 |
| 5,757,787 | A | * | 5/1998 | Dent | 370/330 |
| 5,757,789 | A | * | 5/1998 | Dent | 370/337 |
| 5,805,581 | A | * | 9/1998 | Uchida et al. | 370/335 |
| 5,959,984 | A | * | 9/1999 | Dent | 370/347 |
| 6,084,865 | A | * | 7/2000 | Dent | 370/321 |
| 6,154,661 | A | * | 11/2000 | Goldburg | 455/562.1 |
| 6,597,741 | B1 | * | 7/2003 | Miyazaki | 375/240.25 |
| 6,782,264 | B2 | * | 8/2004 | Anderson | 455/456.1 |
| 6,795,425 | B1 | * | 9/2004 | Raith | 370/345 |
| 6,975,582 | B1 | * | 12/2005 | Karabinis et al. | 370/204 |
| 7,020,207 | B1 | * | 3/2006 | Tavares | 375/240.27 |
| 7,539,925 | B2 | * | 5/2009 | Yamane | 714/774 |
| 2002/0149675 | A1 | | 10/2002 | Abraham et al. | |
| 2003/0126545 | A1 | | 7/2003 | Tan | |
| 2005/0059390 | A1 | | 3/2005 | Sayers et al. | |
| 2005/0237155 | A1 | | 10/2005 | Hohberger et al. | |

OTHER PUBLICATIONS

Corrections for Reception of Multiple MBMS Sessions; 3GPP TSG Geran #25; Montreal, Canada, Jun. 20-24, 2005; GP-051494; 3 pages.

(Continued)

*Primary Examiner*—Joseph D Torres
(74) *Attorney, Agent, or Firm*—Gary J. Cunningham

(57) ABSTRACT

A wireless communication device employs a method for receiving a message stream on a control channel. According to one embodiment, the wireless communication device receives a message on the control channel. The wireless communication devices attempts to decode the message and, if the message is successfully decoded, adds bits of the successfully decoded message to a message attributes list. Some time thereafter, the wireless communication device attempts to decode a subsequent message received on the control channel and, if an error is detected during decoding of the subsequent message, replaces bits in the subsequent message with bits from the message attributes list to produce a modified message. The wireless device then attempts to decode the modified message.

15 Claims, 6 Drawing Sheets

OTHER PUBLICATIONS

Spread SACCH for AMR; 3GPP TSG Geran #25; Montreal, Canada, Jun. 20-24, 2005; GP-051526; 13 pages.

Serial SACCH Repetition; 3GPP TSG Geran #25; Montreal, Canada, Jun. 20-24, 2005; GP-051544; 9 pages.

PCT Search Report and Written Opinion; Nov. 20, 2007; Counterpart PCT Application No. PCT/ US06/61381; 8 pages.

* cited by examiner

METHOD FOR DECODING A RECEIVED CONTROL CHANNEL MESSAGE WITH A PRIORI INFORMATION

BACKGROUND

1. Field

The present disclosure is directed to a method and apparatus for decoding a received message with a priori information. More particularly, the present disclosure is directed to decoding a message received on a control channel based on attributes from previous message streams.

2. Description of Related Art

Presently, wireless wide area networks can include Global System for Mobile communication (GSM) networks, Time Division Multiple Access (TDMA) networks, Code Division Multiple Access (CDMA) networks, cellular networks, and many other wireless wide area networks. These networks use traffic channels for transmitting and receiving data, such as voice data to and from a user using a mobile terminal, such as a cellular phone. These networks also use control channels for transmitting and receiving control signals. The control channels, which may be associated with a specific user traffic, or more generally may be mapped onto a dedicated physical layer resource, may typically be used to transfer control information from the network to a mobile terminal or to report measurement information from the mobile terminal to the network. For example, a GSM network can use a Slow Associated Control Channel (SACCH) to transmit control signals. The SACCH has a low bit rate, is associated uniquely with a specific mobile terminal, and is transmitted periodically with a relatively large time between transmissions. The SACCH can transmit specific control information and messages related to higher protocols, such as neighbor cell information, to a mobile terminal. A connection quality, such as a channel quality, of the mobile terminal with the network can be based on the signal quality of a control channel.

In some networks, including Global System for Mobile communication (GSM) networks, measures of control channel quality, including control channel bit or code block error rates, are often used to determine the fundamental quality of the communication link and to determine whether a link should be maintained or otherwise terminated on the basis of inadequate performance. Unfortunately, since the information transmission rate, modulation type, and error control coding methods applicable respectively to control channels and traffic channels may not be well matched, observation of control channel performance may not always be a useful guide to the performance of a companion traffic channel. For example, for a given ratio of desired signal to interfering signal plus noise ratio, the control channel bit or block error rate may significantly exceed that of an associated traffic channel. If, as in the case of the GSM traffic channel and associated control channel, the quality metric controlling maintenance of the radio channel is based on the control channel block error rate, the radio link may be terminated, either by the network or by the mobile station, even though the block error rate of the traffic channel meets the desired quality of service.

Thus, the channel quality of the control channel may not always accurately reflect the channel quality of a traffic channel. Therefore, if the control channel experiences poor channel quality, a link or call may be terminated, even though a mobile terminal is receiving a good traffic signal and the user is experiencing good communication.

Accordingly, there is a need for improving the decoding of a message received on a channel.

SUMMARY

A method and apparatus for improving the decoding of a message received on a control channel. A message is received on a control channel. The message can be decoded based on information regarding the bits of a successfully decoded message.

BRIEF DESCRIPTION OF THE DRAWINGS

The embodiments of the present disclosure will be described with reference to the following figures, wherein like numerals designate like elements, and wherein.

DETAILED DESCRIPTION

In this document, relational terms such as "first," "second," and the like may be used solely to distinguish one entity or action from another entity or action without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising."

Figure 1:
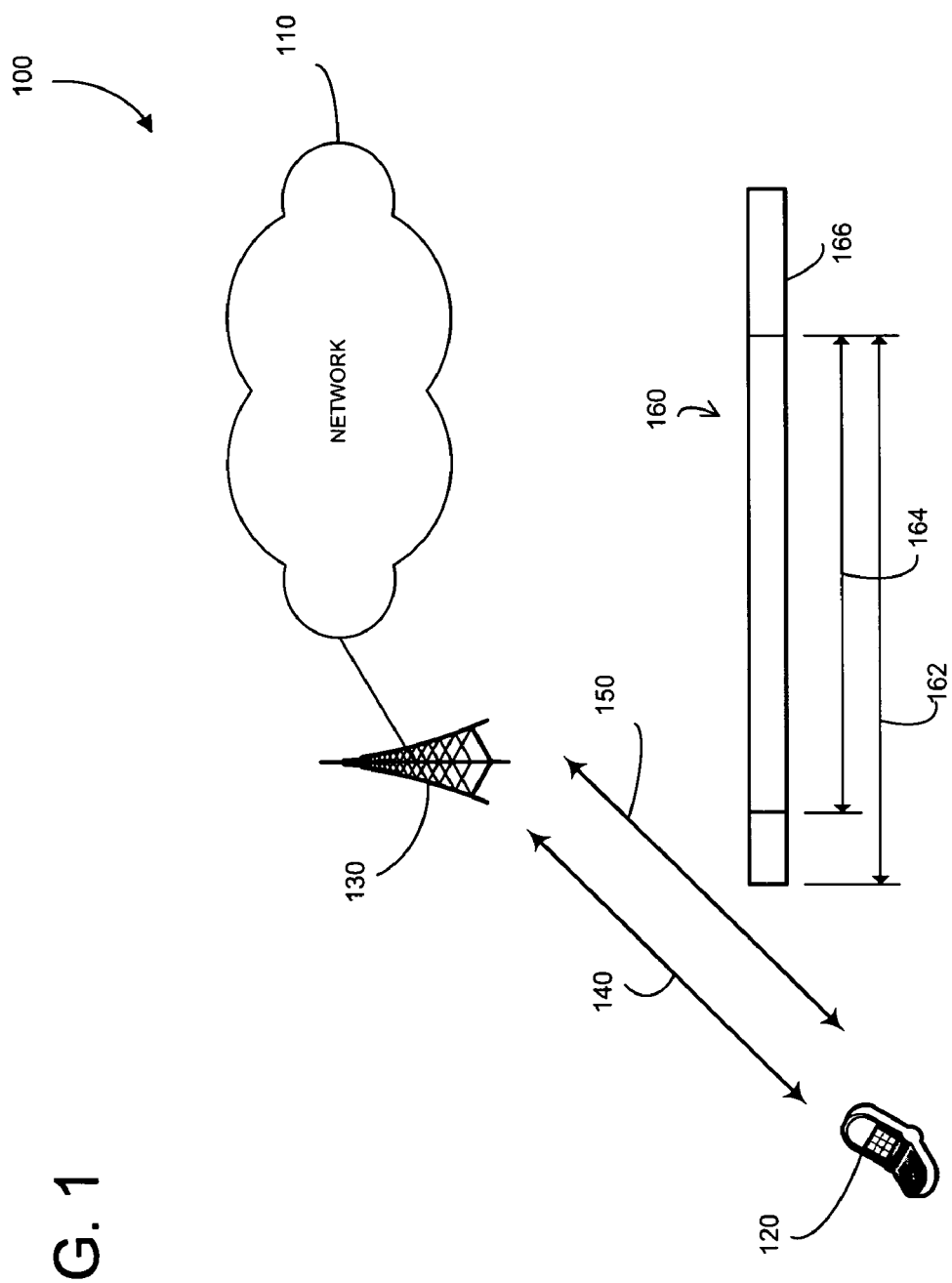
FIG. 1 is an exemplary block diagram of a system according to one embodiment.

FIG. 1 is an exemplary block diagram of a system 100 according to one embodiment. The system 100 can include a network 110, a terminal 120, and a base station 130. The base station 130 and the terminal 120 can communicate with each other using a traffic channel 140 and a control channel 150. For example, the base station 130 can send a message 160 on the control channel 150 to the terminal 120. The control channel can be a Slow Associated Control Channel (SACCH), a Fast Associated Control Channel (FACCH), or any other control channel. The message 160 can include information bits. For example, the message 160 can include bits in a layer 2 message 164, bits in a layer 1 block 162, and additional bits 166. Layer 1 may be a physical layer and layer 2 may be a data link layer, medium access control layer, or the like. The terminal 120 may be a mobile communication device, such as a wireless telephone, a mobile terminal, a mobile station, a cellular telephone, a personal digital assistant, a pager, a personal computer, a selective call receiver, or any other device that is capable of sending and receiving communication signals on a network including wireless network. The network 110 may include any type of network that is capable of sending and receiving signals, such as wireless signals. For example, the network 110 may include a wireless telecommunications network, a cellular telephone network, a satellite communications network, a wireless local area network, a Global System for Mobile Communication (GSM) network, a Time Division Multiple Access (TDMA) network, a Code Division Multiple Access (CDMA) network, and/or other like communications systems.

In operation, the terminal 120 can receive a message 160. The terminal 120 can attempt to decode the message 160 based on information regarding the bits of a successfully decoded message. The information can be a prototype message based on a previously decoded message. The prototype message can be upper layer information, such as layer 2 bits 164 from a previously decoded message. The prototype message can be 168 layer 2 bits 164 of 184 bits of a layer 1 block 162 of a 224 bit previously received message. Attempting to decode the message 160 can include replacing at least a portion of an output of a forward error correction decoder in the terminal 120 with the prototype message. Attempting to decode the message 160 can also include utilizing the prototype message to reduce the number of possible states at relevant stages during convolutional decoding. Attempting to decode the message can additionally include utilizing a portion of a redundancy of a Fire code for error correction of the received message 160.

The information may also be statistical a priori knowledge of message bits in the received message 160 identified from a previous successfully decoded message. The term "a priori" can indicate knowledge obtained from previously known information. For example, redundant layer 2 messages may be sent on the control channel 150, which may be used to assist in decoding a subsequent message, a later redundant message, a previously buffered message, or any other message. Thus, even though no new layer 2 information may be obtained from a redundant message, other information, such as channel quality, may be determined. A Radio Link Timeout (RLT) timer can count the number of failures to receive a correctly decoded message on a control channel. For example, a radio link failure criterion can be based on the RLT. If the terminal 120 is unable to decode a SACCH message, the RLT can be decreased by 1. In the case of a successful reception of a SACCH message the RLT can be increased by 2. In any case the RLT does not exceed a threshold value called RADIO_LINK_TIMEOUT. If the RLT reaches 0 a radio link failure can be declared.

Attempting to decode the message 160 can further include augmenting a metric calculation during a convolutional decoding process. The a priori knowledge may be the probability of selected bits of a message being a one or a zero, the probability of a bit of a message being a one or a zero based on a previously correctly decoded message, the probability of a bit of a message being a one or a zero based on other related bits, and/or other useful a priori knowledge. The terminal 120 can add information regarding the bits of a successfully decoded message to a message attributes list if the message 160 is successfully decoded. The message attributes list may be populated based on frequency of observing a good message, based on knowledge of the role of a message in a protocol structure, based on knowledge that a message is a type that is used often, based on how recently messages in the list were received, or based on any other useful list population method.

To elaborate according to another related embodiment, the terminal 120 can use higher layer message prototypes to assist a lower layer in decoding a message. For example, the terminal 120 can use layer 2/3 message prototypes to assist layer 1 decoding of a SACCH message. As a higher layer receives correctly decoded SACCH messages that are likely to be repeated, it can send a copy of the full message including Layer 1, Layer 2 and Layer 3 headers or a portion of the message to Layer 1 as a prototype message. For example, the SACCH messages that are likely to be repeated can include Sys Info 5, Sys Info 6, Sys Info Sbis, Sys Info Ster, Sys Info 10, measurement information, or any other control channel messages. According to a related example, layer 3 can observe the arrival of correctly decoded layer 3 SACCH messages and inform layer 1 of the relative frequency of occurrence of the observed prototype messages. Layer 1 can then prioritize the storage of prototypes and the order in which layer 1 hypothesizes prototype messages.

The higher layer can determine a SACCH message has been correctly decoded according to a good Fire code syndrome, a good combined Fire Code plus convolutional code metric, or any other method for determining a correctly decoded message. For example, Fire codes are a special class of cyclic redundancy check (CRC) codes which permit efficient correction of burst errors. The weight distribution and even minimum distance for many cyclic codes, including the Fire Code used for SACCH, may not be readily computable. Given the Fire Code generator polynomial $g(D)=g_1(D)g_2(D)=(D^{23}+1)(D^{17}+D^3+1)$ two meaningful comments can be made on the ability of the SACCH Fire code to detect errors. The first is a binary cyclic code with generator polynomial of degree m can detect all burst-error patterns of length m or less. The second is the missed detection probability or ratio of valid n bit words to all possible n bit words is $2^{k-n}$, where k is the number of information bits and n is the codeword length. Therefore, if the SACCH Fire code is generally used only for error detection, it can detect all error patterns, for example, up to burst length 40 and can have a missed detection probability of $2^{-40}$.

Thus, when layer 1 receives the 4 SACCH bursts that comprise a SACCH message it can first attempt to decode the message conventionally. If this fails, it can then replace a hard-decision output of a convolutional decoder with the bits from the first prototype message that are known to be valid. For example, layer 1 may use the Layer 2 and Layer 3 header and the Layer 3 contents, but not necessarily the 2 octets of the Layer 1 header. The Fire code syndrome can then be checked. If successful, the message has been decoded and the results are passed to layer 2. If the Fire code fails, the next prototype message is checked, until all prototypes have been checked. If all the prototypes have been used, the terminal 120 can declare the message as a bad SACCH block.

As an example of convolutional decoding, typically, the decoding of a convolutional code can be performed via a Viterbi trellis with $2^v$ states in each of $N_{info}$ stages where v is the constraint length of the code and $N_{info}$ is the number of information and tail symbols. The decoding process can involve a metric calculation for each trellis state followed by a traceback operation. The metric calculation can be recursive and can be based upon the convolutional code, received codeword, and previous state metric calculations followed by a traceback operation. When hypothesising a layer 2 SACCH message, typically, only the 40 parity symbols and 16 layer 1 header symbols remain to be decoded by the constraint length 4 code. By implication, the states through which the traceback operation should traverse in stages 20 (16+4) to 183 and stage 227 of the Viterbi trellis are known. Conversely, there may be doubt regarding the traversed states in stages 1 to 15 and 184 to 226. Therefore, in order to achieve optimal decoding it can be useful to traverse some or all of the known states in the trellis during the traceback operation. Moreover, depending on the implementation, it may be also useful to modify the state metric calculation to utilize the information of known traversed states to achieve optimal decoding.

Thus, the above operations can improve the decoding of a SACCH message at a terminal 120 and reduce radio link timeouts without requiring modification to the network. The terminal 120 can use layer 2 message prototypes to assist layer 1 decoding of a SACCH message. The terminal 120 can also assemble or learn a set of prototype layer 2 messages based on observing a frame quality indicator, such as a good Fire code syndrome or a good combined Fire plus convolutional code metric. The terminal 120 can also use the relative frequency of observed "good" layer 2 message prototypes to prioritize the storage of a particular prototype message for use in decoding and the order in which layer 1 hypothesizes each prototype layer 2 message. The terminal 120 can additionally replace at least a portion of the output of a forward error correction decoder with each prototype message in turn, and then check the Fire code on each until the message is correctly decoded, until the prototype messages are exhausted, or until a threshold number of attempts are made.

The process can be applicable to receiving a message in any communication network where specific messages, selected from a finite set of messages, are periodically inserted into the message stream. The process can also be applicable to broadcast networks in which header messages, or slowly varying period system information messages of any type are transmitted.

Figure 2:
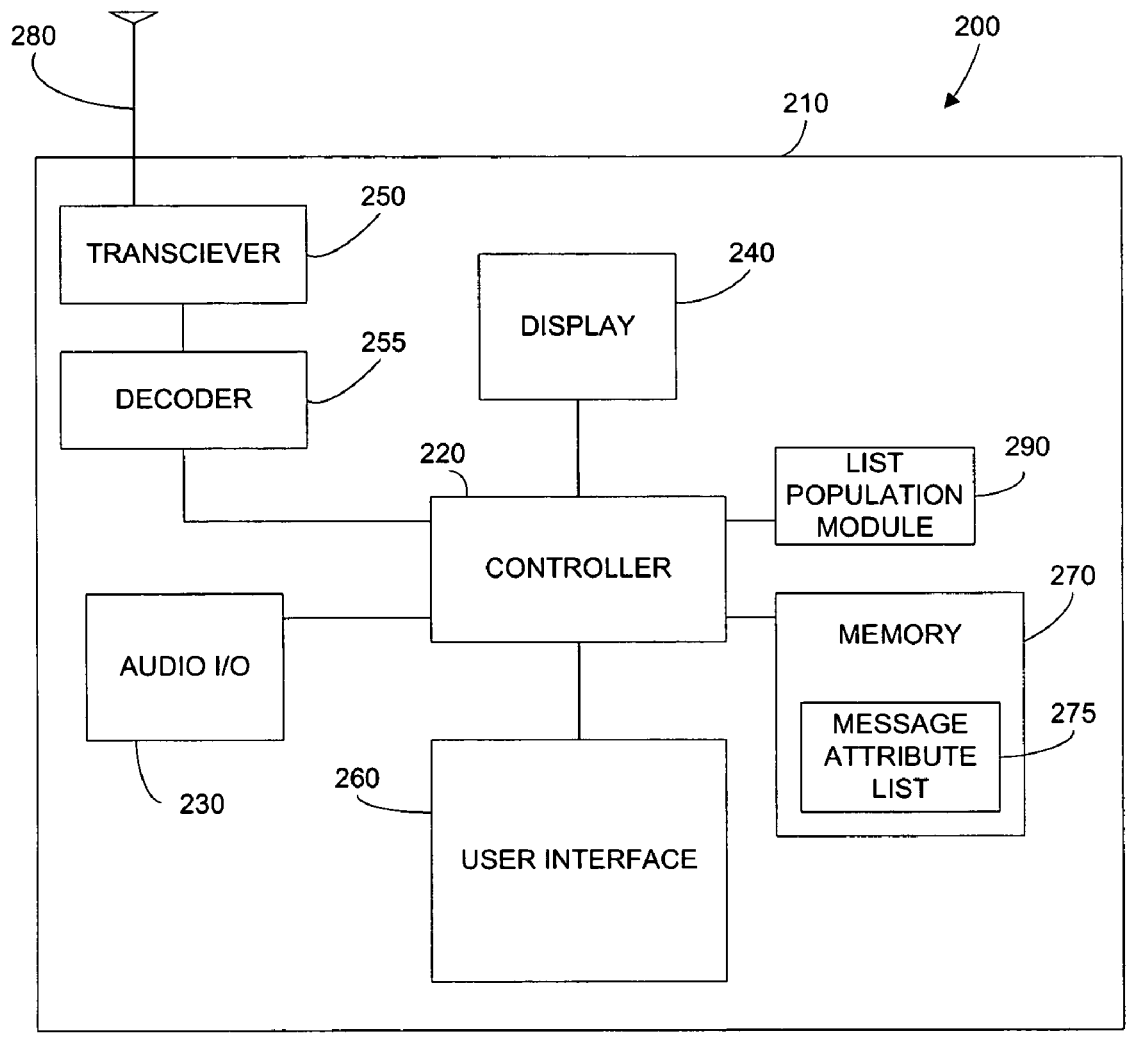
FIG. 2 is an exemplary block diagram of a mobile communication device according to one embodiment.

FIG. 2 is an exemplary block diagram of a mobile communication device 200, such as the terminal 120, according to one embodiment. The mobile communication device 200 can include a housing 210, a controller 220 coupled to the housing 210, audio input and output circuitry 230 coupled to the housing 210, a display 240 coupled to the housing 210, a transceiver 250 coupled to the housing 210, a decoder 255 coupled to the transceiver 250, a user interface 260 coupled to the housing 210, a memory 270 coupled to the housing 210, a message attribute list 275 residing in the memory 270, and an antenna 280 coupled to the housing 210 and the transceiver 250. The mobile communication device 200 can also include a list population module 290. The list population module 290 can be coupled to the controller 220, can reside within the controller 220, can reside within the memory 270, can be an autonomous module, can be software, can be hardware, or can be in any other format useful for a module on a mobile communication device 200.

The display 240 can be a liquid crystal display (LCD), a light emitting diode (LED) display, a plasma display, or any other means for displaying information. The transceiver 250 may include a transmitter and/or a receiver. The audio input and output circuitry 230 can include a microphone, a speaker, a transducer, or any other audio input and output circuitry. The user interface 260 can include a keypad, buttons, a touch pad, a joystick, an additional display, or any other device useful for providing an interface between a user and a electronic device. The memory 270 may include a random access memory, a read only memory, an optical memory, a subscriber identity module memory, or any other memory that can be coupled to a mobile communication device.

In operation, the controller 220 can control the operations of the mobile communication device 200. A receiver portion of the transceiver 250 can receive a message on a control channel. For example, the receiver can receive the message on a slow associated control channel. The decoder 255 can decode the message. The list population module 290 can add an attribute of a successfully decoded message to the message attribute list 275 if the message is successfully decoded. The decoder 255 can attempt to decode a message based on an attribute in the message attribute list 275 if there is an error when previously decoding the message. The attribute can be a prototype message based on the successfully decoded message. The prototype message can be upper layer information from a successfully decoded message. The decoder 255 can also attempt to decode the message based on the message including bits replaced with the prototype message. The controller 220 can additionally utilize a portion of a redundancy of a fire code for error correction of the received message. The attribute may also be statistical a priori knowledge of message bits in the received message identified from previous observations of the message stream.

Figure 3:
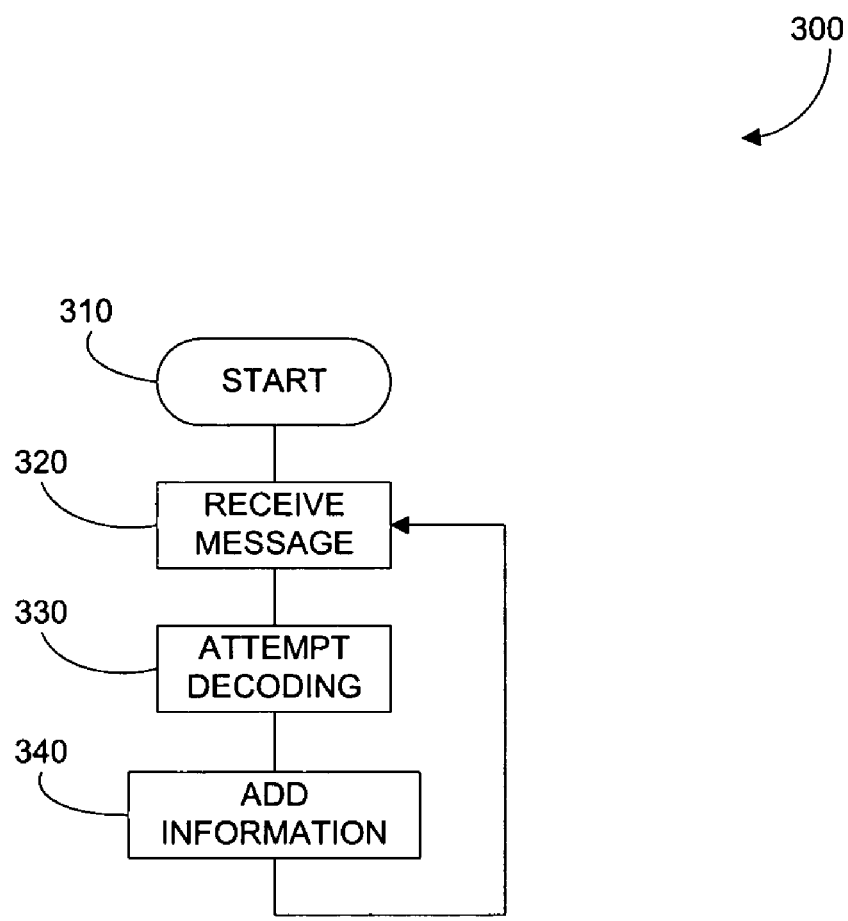
FIG. 3 is an exemplary flowchart illustrating the operation of a mobile communication device according to one embodiment.

FIG. 3 is an exemplary flowchart 300 illustrating the operation of the terminal 120 according to another embodiment. In step 310, the flowchart begins. In step 320, the terminal 120 can receive a message on the control channel 150. The control channel 150 may be a slow associated control channel. In step 330, the terminal 120 can attempt to decode the message. The terminal 120 may attempt to decode the message based on information in a message attributes list if there is an error in decoding the original message. In step 340, the terminal 120 can add information regarding the bits of a successfully decoded message to the message attributes list if the message is successfully decoded. The message attributes list may be a message prototype list. Accordingly, in step 330, the terminal can attempt to decode the subsequent message based on at least one prototype message stored in the message prototype list. Also, in step 340, the terminal 120 may add a prototype message decoded from the received message of the successfully decoded message to the message prototype list if the message is successfully decoded. For example, the prototype message can be an upper layer message. Accordingly, in step 330, the terminal 120 can detect an error in decoding the subsequent message and, if an error is detected, attempt to decode the subsequent message based on at least one prototype message stored in the message prototype list. Additionally, in step 330, if an error is detected, the terminal 120 can replace bits in the subsequent message with a prototype message stored in the message prototype list and attempt to decode the message based on the subsequent message with the replaced bits.

Figure 4:
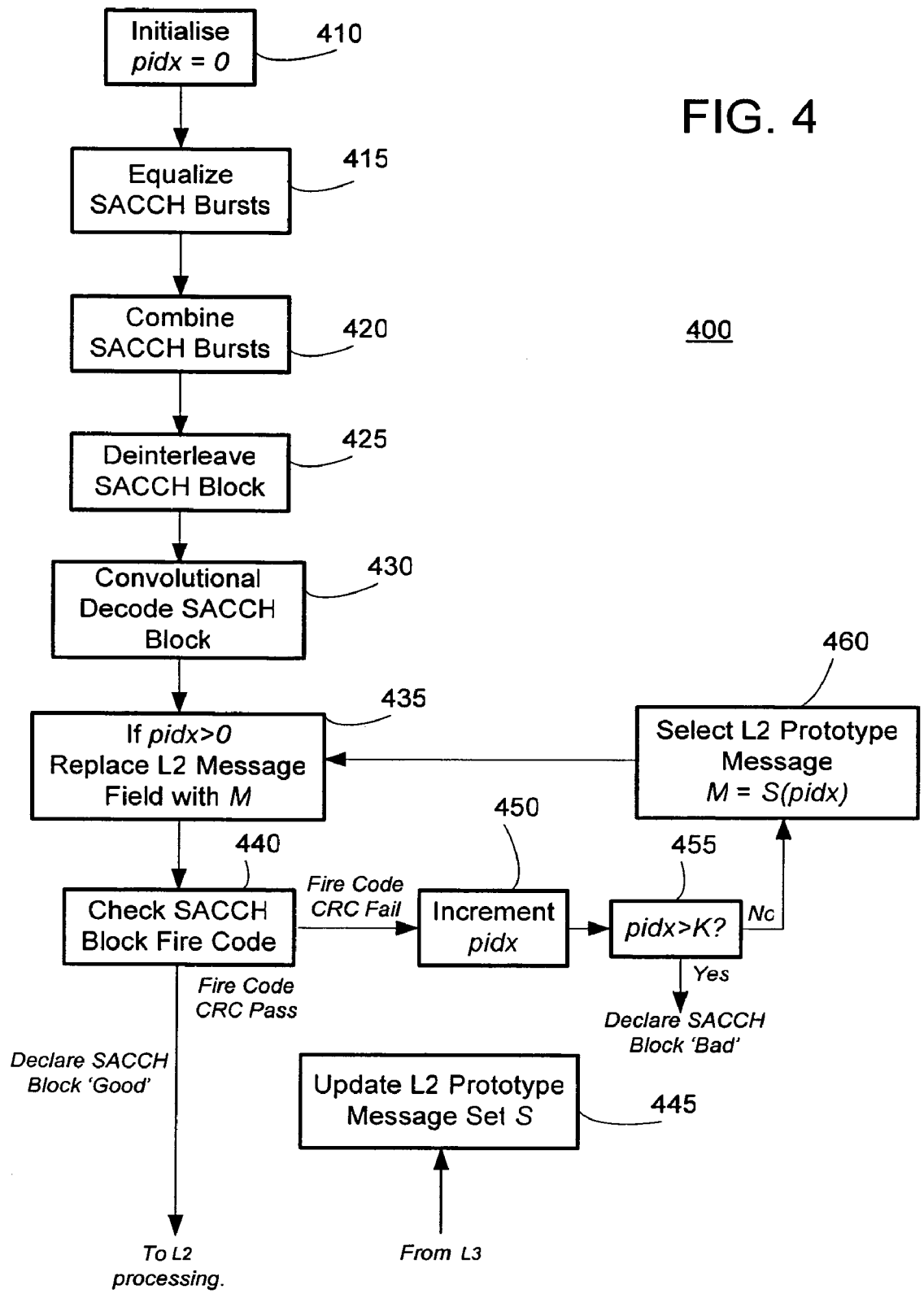
FIG. 4 is an exemplary flowchart illustrating the operation of a mobile communication device according to another embodiment.

FIG. 4 is an exemplary flowchart 400 illustrating the operation of the terminal 120 according to another related embodiment. For example, the flowchart 400 can illustrate the operation of the terminal 120 after it receives a message in four Slow Associated Control Channel (SACCH) bursts in a frame on the control channel 150. In step 410, the terminal 120 can initialize a counter, such as a prototype index counter. In step 415, the terminal 120 can equalize the message to get an estimate of the received data. In step 420, the terminal 120 can combine the estimates from the message. In step 425, the terminal 120 can deinterleave the combined estimates to get a SACCH block. In step 430, the terminal 120 can attempt to convolutionally decode the SACCH block. In step 435, if the counter is greater than zero, indicating there was an error initially decoding the message, the terminal 120 can replace a higher layer message field in the message with a prototype message M from a message prototype list and can attempt to convolutionally decode the modified message. For example, the terminal 120 can replace a layer 2 message field in the message with a prototype message M from a message prototype list. In step 440, the terminal 120 can check a SACCH block fire code. If the message passes the fire code check, the terminal 120 can declare the SACCH block "good" and advance to higher layer processing. In step 445, the terminal 120 can update a higher layer prototype message set S in the message prototype list with a prototype message if the message passes the fire code check. For example, the terminal 120 can update a layer 2 prototype message set S in the message prototype list with a prototype message. If the message fails the fire code check, in step 450, the terminal 120 can increment the counter. In step 455, the terminal 120 can determine if the counter has exceeded a threshold. If so, the terminal 120 can declare the message bad. The threshold may be any useful threshold. For example, the threshold may be the number of messages stored in the message prototype list. If the counter has not exceeded the threshold, in step 460, the terminal 120 can select a layer 2 prototype message M from the message prototype list for replacement in the layer 2 message field in the message and continue to step 435. For example, the terminal 120 can select the replacement layer 2 prototype message incrementally according to the counter.

Figure 5:
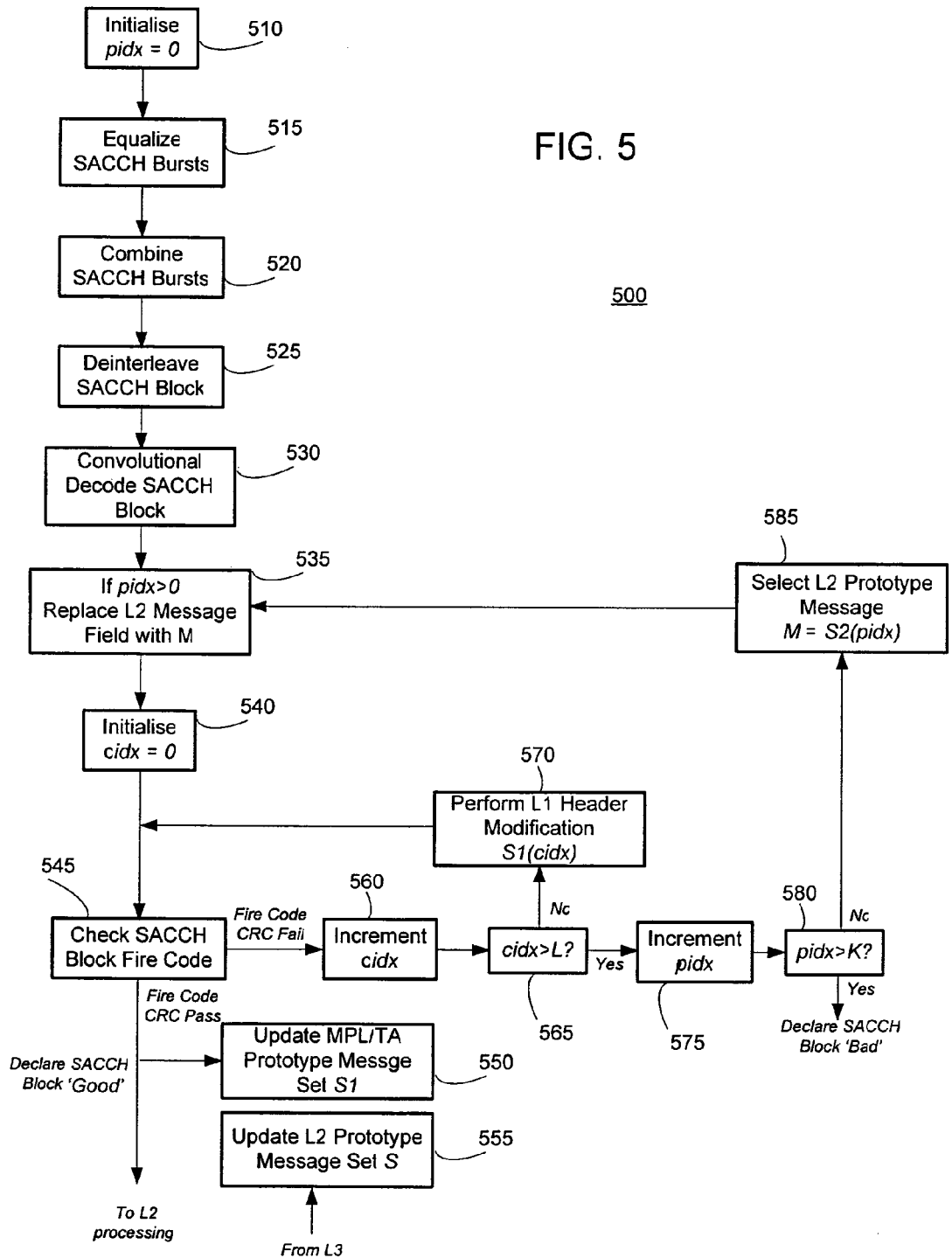
FIG. 5 is an exemplary flowchart illustrating the operation of a mobile communication device according to another embodiment.

FIG. 5 is an exemplary flowchart 500 illustrating the operation of the terminal 120 according to another related embodiment. For example, the flowchart 500 can illustrate the operation of the terminal 120 after it receives a message and uses a layer 1 header hypothesis test. In step 510, the terminal 120 can initialize a counter, such as a prototype index counter. In step 515, the terminal 120 can equalize the message to get an estimate of the received data. In step 520, the terminal 120 can combine the estimates from the message. In step 525, the terminal 120 can deinterleave the combined estimates to get a SACCH block. In step 530, the terminal 120 can attempt to convolutionally decode the SACCH block. In step 535, if the counter is greater than zero, indicating there was an error initially decoding the message, the terminal 120 can replace a layer 2 message field in the message with a prototype message M from a message prototype list and can attempt to decode the modified message. In step 540, the terminal 120 can initialize a second counter. In step 545, the terminal 120 can check a SACCH block fire code. If the message passes the fire code check, the terminal 120 can advance to higher layer processing. The terminal 120 can also update a prototype message, such as layer 1 header information, set in step 550. The layer 1 header information may be a mobile power level field, a timing advance field or any other layer 1 header information. For example, some fields may not change by much in subsequent messages. Thus, actual values along with a possible range of values may be stored in any of the prototype message sets or attribute lists. In step 555, the terminal 120 can additionally update a layer 2 prototype message set S in the message prototype list with a prototype message if the message passes the fire code check. If the message fails the fire code check, in step 560, the terminal 120 can increment the second counter. In step 565, the terminal 120 can determine if the counter has exceeded a threshold. The threshold may be based on the number of prototype headers available. If not, in step 570, the terminal 120 can select a header prototype message from the header prototype message set S1 for replacement in the header field and can again check the Fire Code in step 545. If the second counter has exceeded the threshold, in step 575, the terminal 120 can increment the counter. In step 580, the terminal 120 can determine if the counter has exceeded a threshold. If so, the terminal 120 can declare the message as bad. If the counter has not exceeded the threshold, in step 585, the terminal 120 can select a higher layer prototype message M from the message prototype list S2 for replacement in the layer 2 message field in the message and continue to step 535. For example, the terminal 120 can select a layer 2 prototype message incrementally according to the counter.

Figure 6:
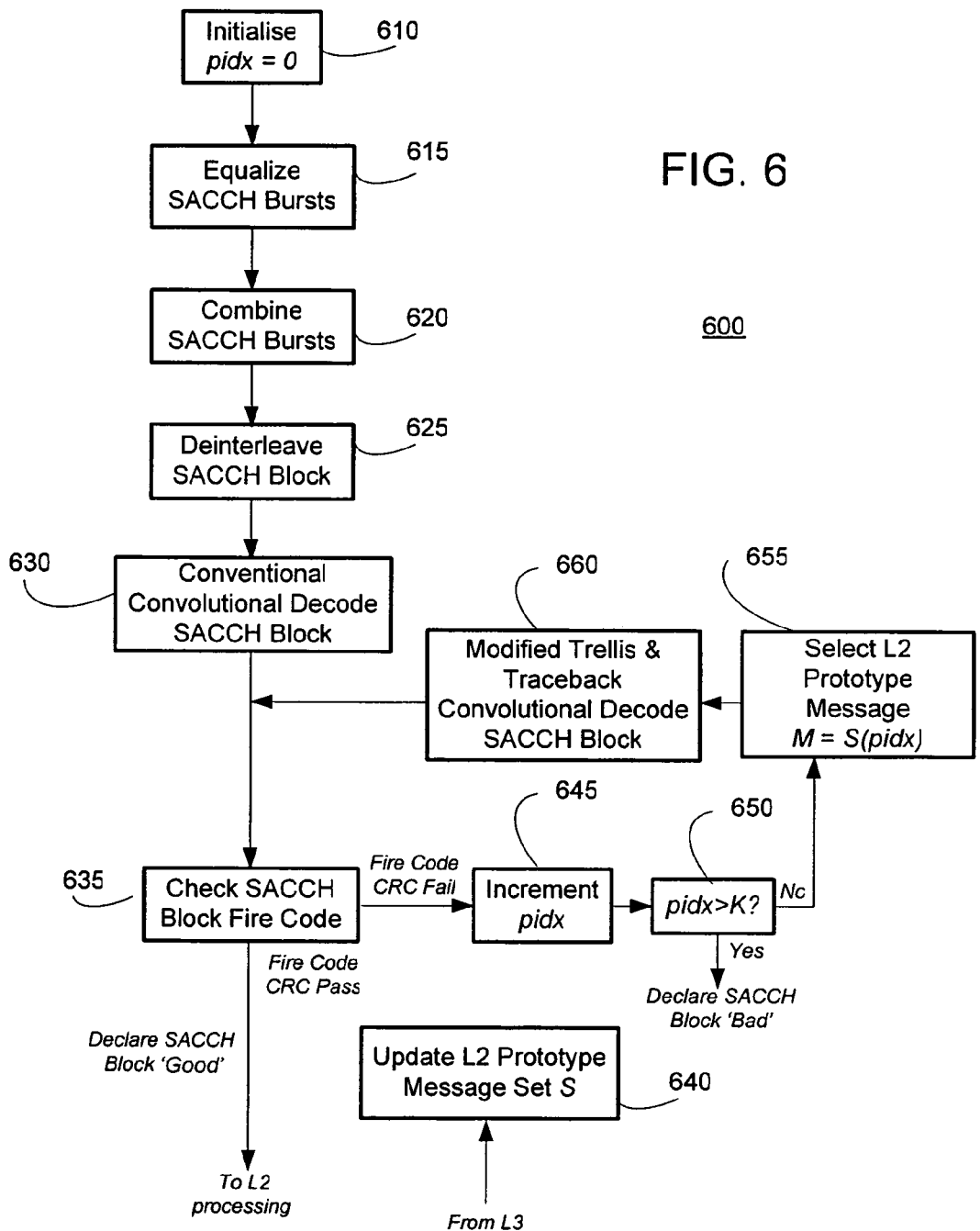
FIG. 6 is an exemplary flowchart illustrating the operation of a mobile communication device according to another embodiment.

FIG. 6 is an exemplary flowchart 600 illustrating the operation of the terminal 120 according to another related embodiment. For example, the flowchart 600 can illustrate the operation of the terminal 120 after it receives a message and modifies a convolutional decoder path initial and termination states, path metric computation, and trace-back processing conditioned on a higher layer message. In step 610, the terminal 120 can initialize a counter, such as a prototype index counter. In step 615, the terminal 120 can equalize the message to get an estimate of the received data. In step 620, the terminal 120 can combine the estimates from the message. In step 625, the terminal 120 can deinterleave the combined estimates to get a SACCH block. In step 630, the terminal 120 can convolutionally decode the SACCH block using a conventional decoding method. In step 635, the terminal 120 can check a SACCH block fire code. If the message passes the fire code check, the terminal 120 can declare the SACCH block as "good" and advance to higher layer processing. In step 640, the terminal 120 can update a higher layer prototype message set S in the message prototype list with a prototype message if the message passes the fire code check. For example, the terminal 120 can update a layer 2 prototype message set S in the message prototype list with a prototype message. If the message fails the fire code check, in step 645, the terminal 120 can increment the counter. In step 650, the terminal 120 can determine if the counter has exceeded a threshold. If so, the terminal 120 can declare the SACCH block bad. The threshold may be any useful threshold. For example, the threshold may be the number of messages stored in the message prototype list. If the counter has not exceeded the threshold, in step 655, the terminal 120 can select a layer 2 prototype message M from the message prototype list for replacement in the layer 2 message field in the message. For example, the terminal 120 can select a layer 2 prototype message according to the counter. In step 660, the terminal can use a modified trellis and traceback decoding method on the SACCH block and return to step 635. For example, modified trellis construction can mean updating the trellis state metrics of a forward error correction decoder, such as the Viterbi algorithm, or other finite-state hypothesis device, to only permit state transitions, or symbol hypotheses, consistent with the prototype message M. Similarly, traceback decoding can mean selecting the decoded sequence according to the trellis state metrics, but only permitting the considered paths through the trellis in accordance with the prototype message M.

According to an alternate related embodiment, during or after step 660, the terminal can allow a Fire decoder to correct a 17 bit or less burst error sequence in a layer 1 header or parity field.

The method of this disclosure is preferably implemented on a programmed processor. However, the controllers, flowcharts, and modules may also be implemented on a general purpose or special purpose computer, a programmed microprocessor or microcontroller and peripheral integrated circuit elements, an ASIC or other integrated circuit, a hardware electronic or logic circuit such as a discrete element circuit, a programmable logic device such as a PLD, PLA, FPGA or PAL, or the like. In general, any device on which resides a finite state machine capable of implementing the flowcharts shown in the Figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, the preferred embodiments of the disclosure as set forth herein are intended to be illustrative, not limiting. Various changes may be made without departing from the spirit and scope of the disclosure.

What is claimed is:

1. A method for a wireless communication device to receive a message stream on a wireless control channel, the method comprising:
   receiving at least one message on the control channel;
   attempting to decode the at least one message;
   adding bits of the at least one message to a message attributes list if the at least one message is successfully decoded;
   receiving a subsequent message on the control channel;
   attempting to decode the subsequent message;
   replacing bits in the subsequent message with bits from the message attributes list to produce a modified message if an error is detected during decoding of the subsequent message; and
   attempting to decode the modified message.

2. The method according to claim 1, wherein receiving a message on the control channel comprises receiving a message on a slow associated control channel.

3. The method according to claim 1, wherein the message attributes list comprises a message prototype list, wherein the bits of the at least one message form at least one prototype message of the message prototype list, and wherein replacing bits in the subsequent message with bits from the message attributes list comprises replacing bits in the subsequent message with at least one prototype message stored in the message prototype list to produce the modified message.

4. The method according to claim 3, wherein the at least one prototype message comprises at least one upper layer prototype message derived from bits in a communication protocol layer above a physical layer of the at least one message, and wherein replacing bits in the subsequent message with bits from the message attributes list comprises:
   replacing bits in the subsequent message with at least one upper layer prototype message to produce the modified message.

5. The method according to claim 4, wherein the message prototype list further includes at least one header prototype message derived from bits at the physical layer of the at least one message, and wherein replacing bits in the subsequent message with bits from the message attributes list Thither comprises:
   replacing bits in the subsequent message with at least one header prototype message.

6. The method according to claim 4, further comprising:
   updating trellis state metrics of a forward error correction decoder to permit state transitions consistent with the at least one upper layer prototype message; and
   selecting a decode sequence according to the trellis state metrics, but only permitting considered paths through a trellis in accordance with the at least one upper layer prototype message.

7. The method according to claim 4, wherein replacing bits in the subsequent message with at least one upper layer prototype message comprises replacing bits of a upper communication protocol layer of the subsequent message with at least one layer 3 prototype message derived from bits of a layer 3 communication protocol layer of the at least one message.

8. The method according to claim 4, wherein the message prototype list further includes at least one header prototype message derived from bits at the physical layer of the at least one message, the method further comprising:
   detecting whether an error in decoding of the modified message occurred after bits of the upper communication protocol layer of the subsequent message were replaced with at least one upper layer prototype message from the message prototype list; and
   if an error occurred, replacing a header field of the modified message with a header prototype message item the message prototype list.

9. The method according to claim 4, wherein replacing bits in the subsequent message with at least one upper layer prototype message comprises replacing bits in the subsequent message with at least one prototype message derived from bits in at least one of a layer 2 communication protocol layer and a layer 3 communication protocol layer of the at least one message.

10. The method of claim 3, wherein the at least one prototype message comprises at least one layer 2 prototype message derived from bits in a layer 2 communication protocol layer of the at least one message, and wherein replacing bits in the subsequent message with at least one prototype message stored in the message prototype list comprises:
   replacing bits in the subsequent message with at least one layer 2 prototype message to produce the modified message.

11. The method of claim 10, wherein replacing bits in the subsequent message with at least one layer 2 prototype message comprises replacing bits in the subsequent message with at least one prototype message derived from bits in a data link layer or a medium access control layer of the at least one message.

12. The method of claim 10, wherein replacing bits in the subsequent message with at least one layer 2 prototype message comprises replacing a layer 2 message field of the subsequent message with a layer 2 prototype message from the message prototype list to produce the modified message.

13. The method according to claim 1, wherein the message attributes list is a message prototype list and wherein adding bits of the at least one message to the message attributes list comprises:
   updating a layer 2 prototype message set in the message prototype list with bits from a layer 2 communication protocol layer of the at least one message if the at least one message is successfully decoded.

14. The method according to claim 1, wherein the message attributes list is a message prototype list ad wherein adding bits of the at least one message to the message attributes list comprises:
   updating a layer 1 header prototype message set in the message prototype list with bits from at least one header of a layer 1 communication protocol layer of the at least one message if the at least one message is successfully decoded, wherein the layer 1 communication protocol layer of the at least one message corresponds to a physical layer of the at least one message.

15. The method according to claim 1, wherein attempting to decode the at least one message comprises attempting to convolutionally decode the at least one message.

* * * * *